United States Patent
Park et al.

(10) Patent No.: US 9,466,386 B2
(45) Date of Patent: Oct. 11, 2016

(54) STORAGE DEVICE AND RELATED PROGRAMMING METHOD

(71) Applicant: SAMSUNG ELECTRONICS CO., LTD., Suwon-Si, Gyeonggi-Do (KR)

(72) Inventors: Hyun-Wook Park, Hwaseong-Si (KR); Jung-Soo Kim, Yongin-Si (KR); Jaeyong Jeong, Yongin-Si (KR); Kitae Park, Seongnam-Si (KR); Youngsun Song, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 14/336,343

(22) Filed: Jul. 21, 2014

(65) Prior Publication Data
US 2015/0117100 A1    Apr. 30, 2015

(30) Foreign Application Priority Data
Oct. 24, 2013    (KR) ........................ 10-2013-0127421

(51) Int. Cl.
G11C 16/04    (2006.01)
G11C 16/34    (2006.01)
G11C 16/22    (2006.01)
G11C 16/10    (2006.01)

(52) U.S. Cl.
CPC ............. *G11C 16/225* (2013.01); *G11C 16/10* (2013.01); *G11C 16/0483* (2013.01)

(58) Field of Classification Search
CPC .. G11C 16/10; G11C 16/0483; G11C 16/225

USPC .................................................... 365/185.03
See application file for complete search history.

(56) References Cited

U.S. PATENT DOCUMENTS

| | | | |
|---|---|---|---|
| 7,443,726 B2 | 10/2008 | Guterman | |
| 8,526,245 B2 | 9/2013 | Yoon et al. | |
| 2008/0212367 A1 | 9/2008 | Kim et al. | |
| 2010/0037034 A1 | 2/2010 | Balakrishnan et al. | |
| 2010/0142282 A1 | 6/2010 | Kim et al. | |
| 2010/0318721 A1 | 12/2010 | Avila et al. | |
| 2011/0292725 A1 | 12/2011 | Choi et al. | |
| 2013/0135923 A1 | 5/2013 | Yon | |
| 2015/0006939 A1* | 1/2015 | Lim | G11C 5/148 713/324 |
| 2015/0095558 A1* | 4/2015 | Kim | G06F 12/0246 711/103 |

FOREIGN PATENT DOCUMENTS

| | | |
|---|---|---|
| KR | 100816154 B1 | 3/2008 |
| KR | 1020110030069 A | 3/2011 |
| KR | 1020110095706 A | 8/2011 |
| KR | 1020110131984 A | 12/2011 |
| KR | 1020130060687 A | 6/2013 |

* cited by examiner

*Primary Examiner* — Toan Le
(74) *Attorney, Agent, or Firm* — Volentine & Whitt, PLLC

(57) ABSTRACT

A method of programming a storage device comprises determining whether at least one open page exists in a memory block of a nonvolatile memory device, and as a consequence of determining that at least one open page exists in the memory block, closing the at least one open page through a dummy pattern program operation, and thereafter performing a continuous writing operation on the memory block.

16 Claims, 18 Drawing Sheets

STORAGE DEVICE AND RELATED PROGRAMMING METHOD

CROSS-REFERENCE TO RELATED APPLICATIONS

This application claims priority under 35 U.S.C. §119 to Korean Patent Application No. 10-2013-0127421 filed Oct. 24, 2013, the subject matter of which is hereby incorporated by reference.

BACKGROUND OF THE INVENTION

The inventive concept relates generally to electronic memory technologies. More particularly, certain embodiments of the inventive concept relate to storage devices comprising nonvolatile memory and related programming methods using continuous programming.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been a continuing increase in the demand for nonvolatile memory devices. Accordingly, in an effort to address this demand, researchers are engaged in continual efforts to improve various aspects of nonvolatile memory devices, such as their performance, storage capacity, and reliability.

SUMMARY OF THE INVENTION

In one embodiment of the inventive concept, a method is provided for programming a storage device comprising at least one nonvolatile memory device and a memory controller. The method comprises determining whether at least one open page exists in a memory block of the nonvolatile memory device, and as a consequence of determining that at least one open page exists in the memory block, closing the at least one open page through a dummy pattern program operation, and thereafter performing a continuous writing operation on the memory block.

In another embodiment of the inventive concept, another method is provided for programming a storage device comprising at least one nonvolatile memory device and a memory controller. The method comprises determining whether at least one open page exists in a memory block, flushing data of a programmed page corresponding to the at least one open page into a buffer area, and performing a continuous writing operation using the flushed page data and user data in the memory block while closing the at least one open page.

In yet another embodiment of the inventive concept, another method is provided for programming a storage device comprising at least one nonvolatile memory device and a memory controller. The method comprises performing a first Quad Level Cell (QLC) program operation at a memory block, performing a dummy pattern program operation on at least one page associated with at least one dummy wordline of the memory block, and after the dummy pattern program operation, performing a continuous writing operation at the memory block to perform a second QLC program operation.

These and other embodiments of the inventive concept can potentially improve the use of storage space in nonvolatile memory devices, especially following certain events such as an unexpected loss of power.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

In certain embodiments described below, a nonvolatile memory device detects an open page in a memory block, closes the at least one open page by performing a dummy pattern program operation on the at least one open page, and performs a continuous writing operation on the memory block.

Certain embodiments will be described with reference to a NAND flash memory device, but the inventive concept is not limited thereto. Alternatively, the described concepts could be applied to other forms of nonvolatile memory, such as VNAND, NOR flash, RRAM, PRAM, MRAM, and Spin Transfer Torque Random Access Memory (STT-RAM), to name a few examples.

Figure 1:
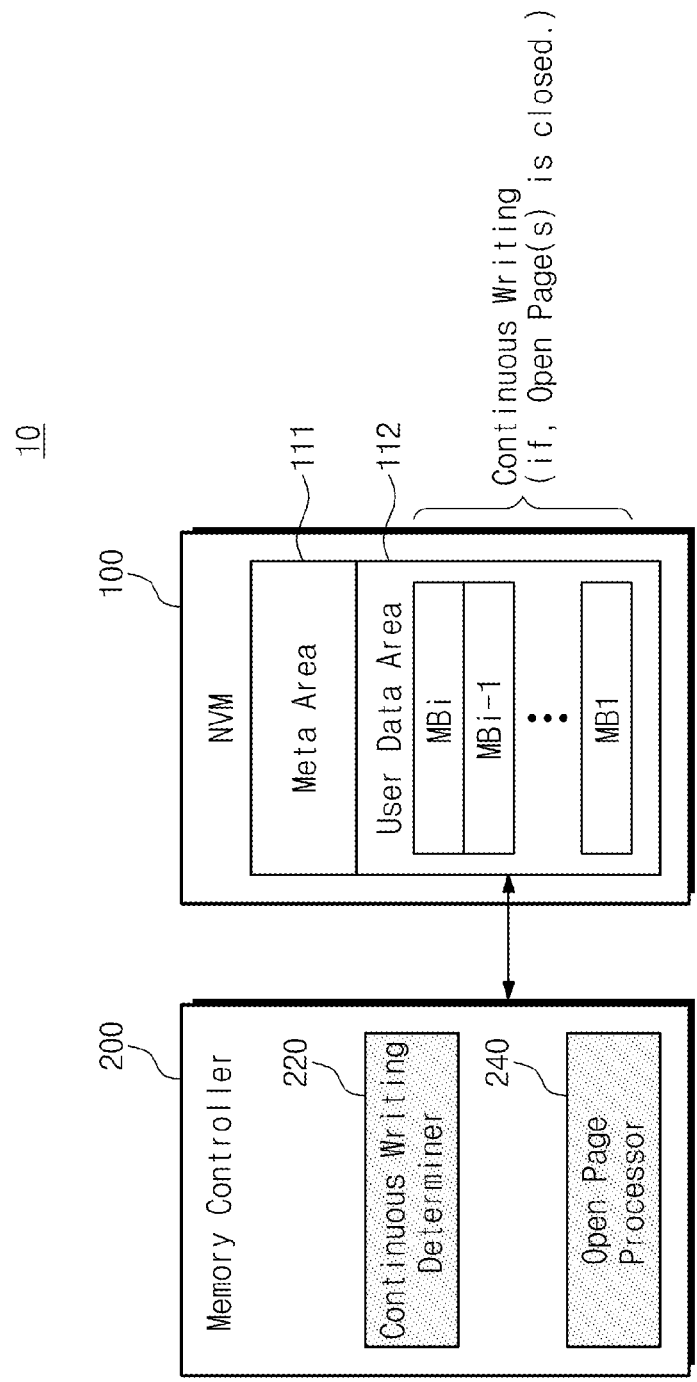
FIG. 1 is a block diagram illustrating a storage device according to an embodiment of the inventive concept.

FIG. 1 is a block diagram illustrating a storage device 10 according to an embodiment of the inventive concept.

Referring to FIG. 1, storage device 10 comprises at least one nonvolatile memory device 100 and a memory controller 200 that controls nonvolatile memory device 100.

Nonvolatile memory device 100 comprises a meta area 111 and a user data area 112. Meta area 111 may be used to store management information for managing the nonvolatile memory device 10, and user data area 112 may be used to store user data.

Meta area 111 comprises at least one memory block. A structure of the at least one memory block of meta area 111 may be the same as the structure of memory blocks in user data area 112. Meta area 111 may store a table that includes information associated with programmed pages of a memory block.

User data area 112 comprises a plurality of memory blocks MB1 to MBi (i>1). A continuous writing operation on each of the memory blocks MB1 to MBi is performed after closing an open page or while closing an open page. In certain embodiments, the continuous writing operation may be a multi-bit program operation or a single-bit program operation.

Memory controller 200 may close an open page of a memory block before the continuous writing operation, or it may close an open page while performing the continuous writing operation. Memory controller 200 comprises a continuous writing determiner 220 and an open page processor 240.

Continuous writing determiner 220 determines whether to perform a continuous writing operation on a memory block. In some embodiments, continuous writing determiner 220 determines whether a memory block read requested includes an open page, and it may decide the continuous writing operation when the memory block read requested includes an open page. Here, whether a memory block read requested includes an open page may be determined using a map table (e.g., stored in meta area 111) indicating whether pages are programmed. In some other embodiments, continuous writing determiner 220 may determine whether a memory block includes an open page at generation of sudden power-off.

Open page processor 240 may close an open page of a memory block. For example, open page processor 240 may close an open page by programming the open page with dummy pattern data (or, dummy data) (or, by performing a dummy pattern program operation). In some embodiments, the dummy pattern data may be random data. In some other embodiments. The dummy pattern data may have a fixed value. In some embodiments, the continuous writing operation may be performed according to an address scramble manner.

In some embodiments, open page processor 240 programs dummy pattern data in open pages that are generated according to the address scramble manner. Meanwhile, open page processor 240 may be implemented to close an open page without a request of continuous writing determiner 220. For example, as a consequence of determining that an open page is generated upon sudden power-off, open page processor 240 may close an open page by immediately performing the dummy pattern program operation.

Where an open page is generated in a memory block, a conventional storage device may close the open page. Afterwards, the conventional storage device may perform the continuous writing operation by storing data programmed at the memory block in a new memory block. This may result in a loss of a storage space according to the open page. On the other hand, where an open page is generated in a memory block, storage device 10 may close the open page to allow a continuous writing operation in the same memory block. This may prevent a loss of a storage space according to the open page.

Figure 2:
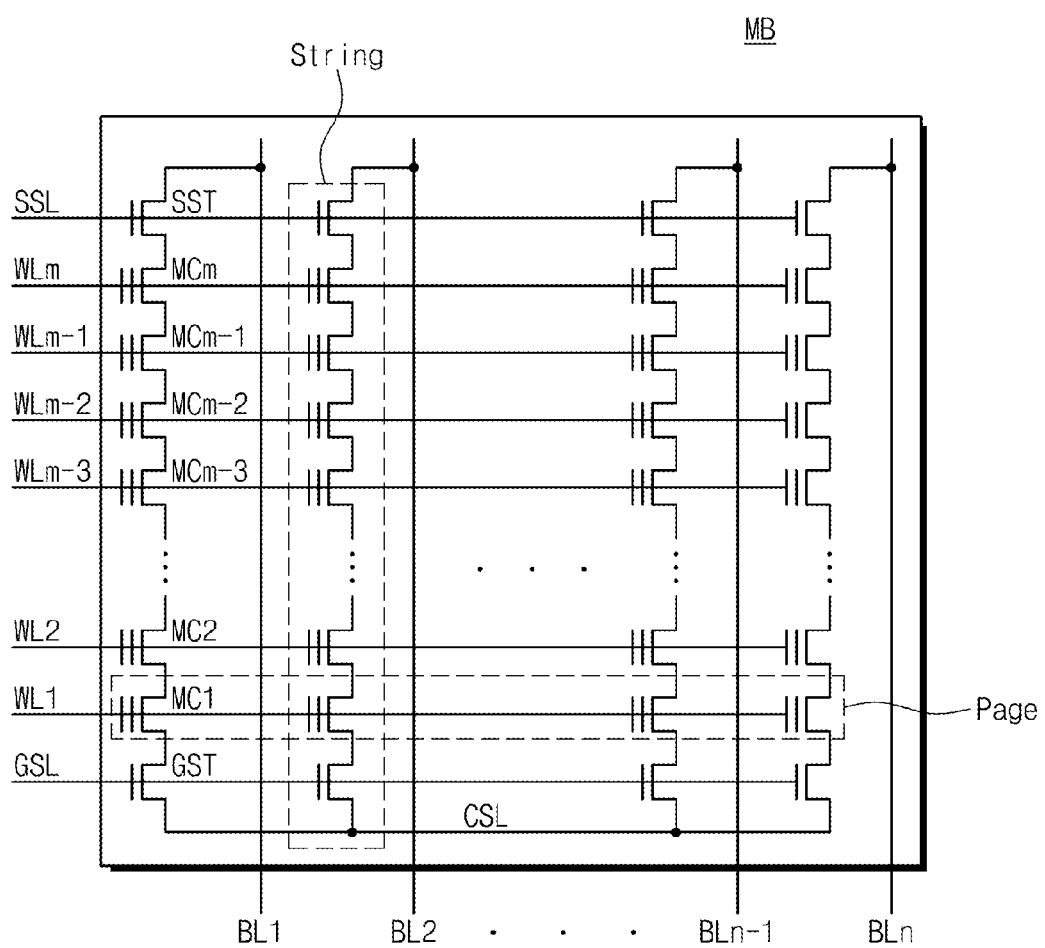
FIG. 2 is a circuit diagram illustrating a memory block shown in FIG. 1 according to an embodiment of the inventive concept.

FIG. 2 is a circuit diagram illustrating a memory block MB shown in FIG. 1 according to an embodiment of the inventive concept.

Referring to FIG. 2 a memory block MB comprises strings respectively connected to a plurality of bitlines BL1 to BLn (n>1). Each string is connected between a corresponding bitline and a common source line and comprises at least one string selection transistor SST, a plurality of memory cells MC1 to MCm (m>1), and at least one ground selection transistor GST. Each of memory cells MC1 to MCm may store one or more data bits.

Each of wordlines WL1 to WLm may be connected to a plurality of memory cells. Memory cells connected to each wordline may be referred to as a page. Wordline voltages (e.g., a program voltage, a pass voltage, a read voltage, a read pass voltage, etc.) may be applied to each wordline. A string selection voltage for controlling the string selection transistors SST may be applied to a string selection line SSL. A ground selection voltage for controlling the ground selection transistors GST may be applied to a ground selection line GSL.

For convenience, the following description presents a method that closes open pages associated with a 3-bit program operation using a shadow program manner. However, the inventive concept is not limited 3-bit program operations or to the shadow program manner. For example, the inventive concept may be applied to a multi-bit program operation using a reprogramming manner.

Figure 3:
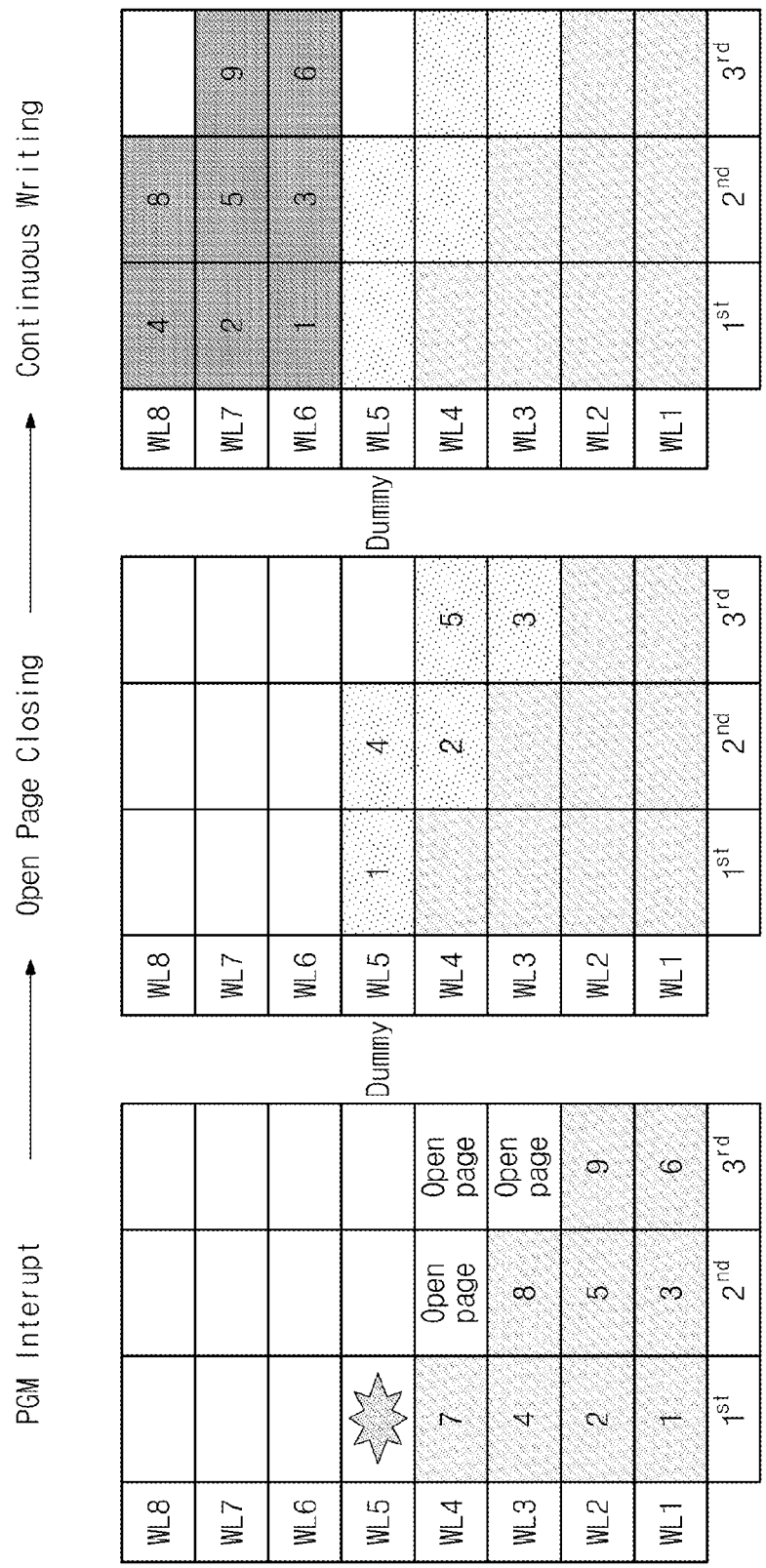
FIG. 3 is a diagram for describing a method of closing open pages in a storage device, according to an embodiment of the inventive concept.

FIG. 3 is a diagram for describing a method of closing open pages in a storage device, according to an embodiment of the inventive concept.

Referring to FIG. 3, a program sequence may be performed in a memory block according to an address scramble manner (1→2→3→ . . . →9). In FIG. 3 and other drawings, only eight wordlines WL1 through WL8 are illustrated, but the presence of additional wordlines is assumed. For example, in a "continuous writing" portion of FIG. 3, a seventh page program operation is assumed to occur with respect to a first page of a ninth wordline WL9 before an eighth page program operation occurs with respect to a second page of an eighth wordline WL8 and a ninth page program operation occurs with respect to a second page of a ninth wordline WL9.

For explanation purposes, it is assumed that the program sequence is suddenly ended during a first page program operation on a fifth wordline WL5. For example, the program sequence may be ended at sudden power-off, e.g., an expected power outage. In this case, as illustrated in FIG. 3, a memory block may include open pages: a third page of a third wordline WL3 and second and third pages of a fourth wordline WL4.

In some embodiments, a first page program operation may be a 1-bit (or first order bit) program operation, a second page program operation may be a 2-bit (or second order bit) program operation, and a third page program operation may be a 3-bit (or third order bit) program operation.

Open pages thus generated may be closed before continuous writing on the memory block. The closing of an open page, as illustrated in FIG. 3, may be to sequentially program some pages of the fifth wordline WL5 and the open pages with dummy pattern data according to an address scramble manner. Below, fifth wordline WL5 may be referred to as a dummy wordline. Dummy wordline WL5 may be an upper wordline adjacent to uppermost wordline WL4 of wordlines each including one or more open pages. After the open page closing, continuous writing may be performed with respect to pages associated with upper wordlines (e.g., WL6, WL7, WL8, etc.) above dummy wordline WL5.

In the example of FIG. 3, only some of the pages of fifth wordline WL5 are programmed with dummy pattern data. In alternative embodiments, however, all of the pages of fifth wordline WL5 may be programmed with dummy pattern data, as illustrated for instance in FIG. 4.

Figure 4:
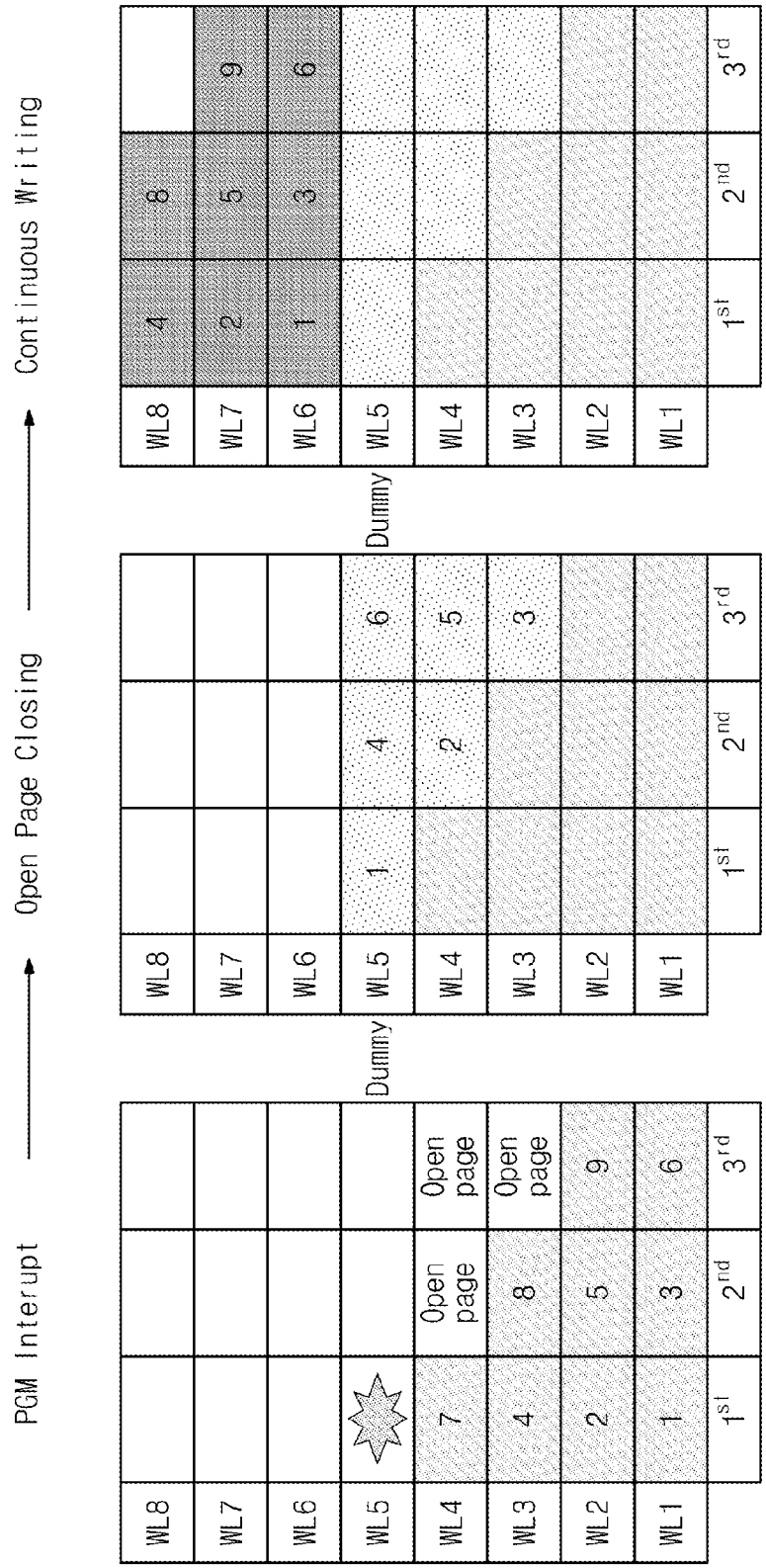
FIG. 4 is a diagram for describing a method of closing open pages in a storage device, according to a second embodiment of the inventive concept.

FIG. 4 is a diagram for describing a method of closing open pages in a storage device, according to a second embodiment of the inventive concept. The method of FIG. 4 differs from that of FIG. 3 in that all pages associated with dummy wordline WL5 are programmed with dummy pattern data. That is, continuous writing may be performed after open pages and pages associated with dummy wordline WL5 are closed. In this example, the pages of dummy wordline WL5 and open pages are programmed with dummy pattern data according to an address scramble manner.

In the methods of FIGS. 3 and 4, at least one page associated with the open wordline WL5 is programmed. However, the inventive concept is not limited to closing open wordlines alone. For example, when closing open pages, pages of at least two dummy wordlines may be programmed with dummy pattern data, as illustrated for instance in FIG. 5.

Figure 5:
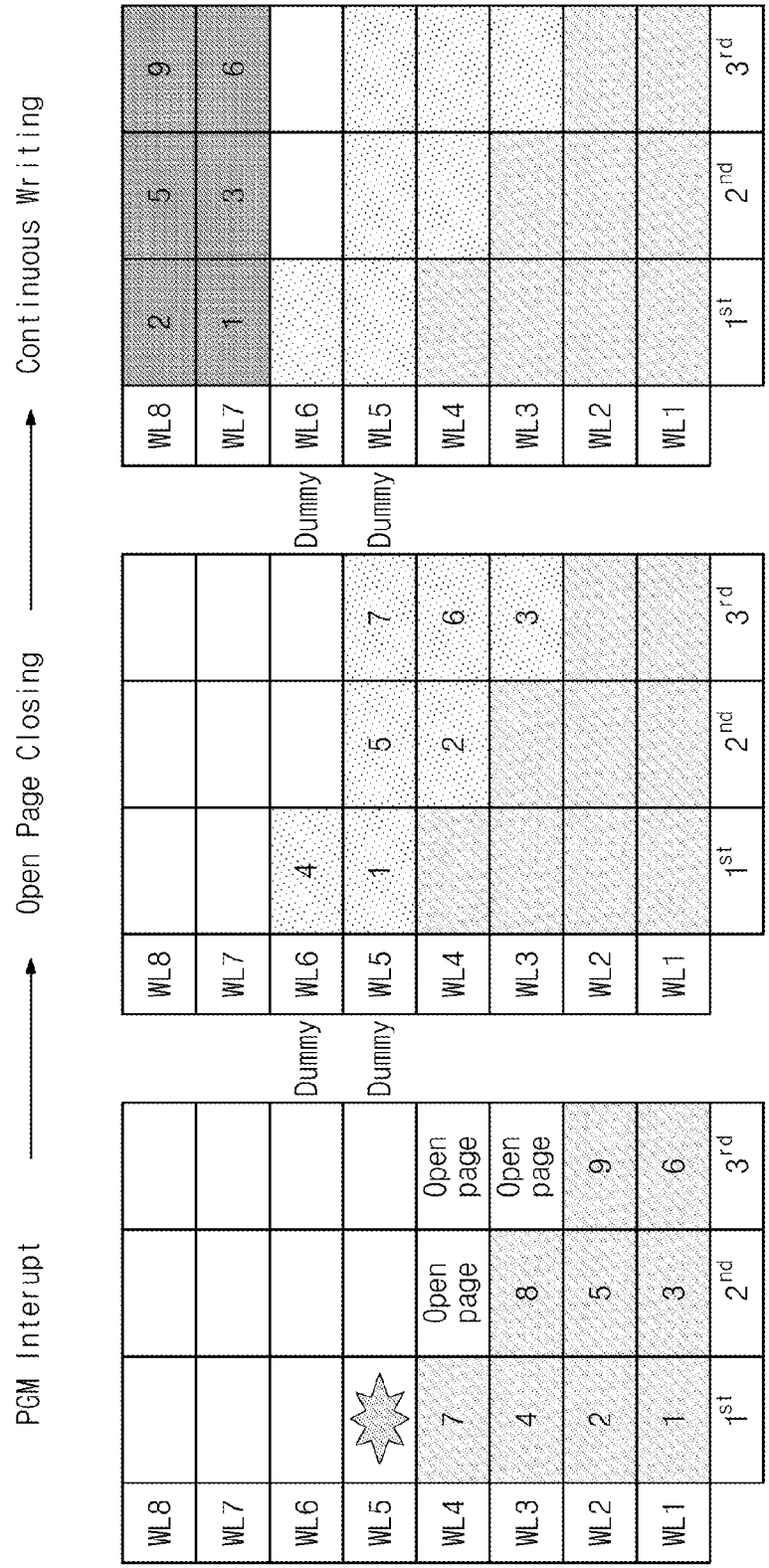
FIG. 5 is a diagram for describing a method of closing open pages in a storage device, according to a third embodiment of the inventive concept.

FIG. 5 is a diagram for describing a method of closing open pages in a storage device, according to a third embodiment of the inventive concept. A method of closing open pages of FIG. 5 may be different from that of FIG. 3 or 4 in that pages of two dummy wordlines WL5 and WL6 are programmed with dummy pattern data. That is, continuous writing may be performed after open pages are closed by programming dummy pattern data in the open pages, pages associated with a first dummy wordline, and at least one page associated with a second dummy wordline.

In some embodiments, second dummy wordline WL6 may be an upper wordline immediately adjacent to first dummy wordline WL5.

In the method of FIG. 5, all pages associated with first dummy wordline WL5, and at least one page associated with second dummy wordline WL6 are programmed with dummy pattern data according to a predetermined order. With the predetermined order, address scramble may be used until open pages are closed (Open Page Closing: 2, 3, and 6), as illustrated in FIG. 5, and then, pages associated with the first dummy wordline WL5 may be closed. In the closing of open pages as shown in FIG. 5, address scramble may be used until open pages are closed. However, the inventive concept is not limited thereto. For example, the open page closing may be performed such that open pages and pages associated with dummy wordlines are programmed with dummy pattern data according to address scramble.

Figure 6:
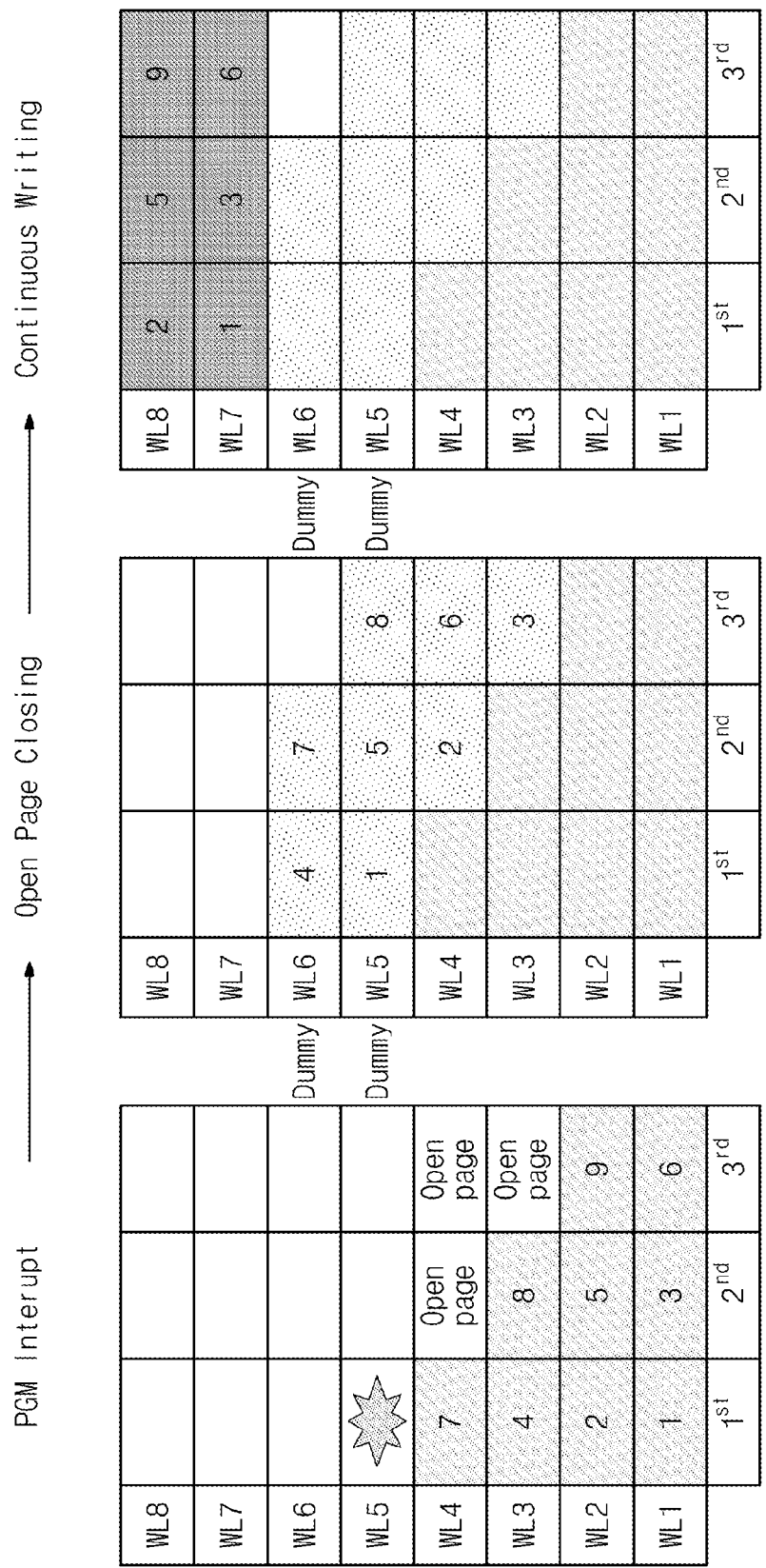
FIG. 6 is a diagram for describing a method of closing open pages in a storage device, according to a fourth embodiment of the inventive concept.

FIG. 6 is a diagram for describing a method of closing open pages in a storage device, according to a fourth embodiment of the inventive concept.

Referring to FIG. 6, open pages, all pages associated with a dummy wordline WL5, and some pages associated with a second dummy wordline WL6 are programmed with dummy pattern data for open page closing. Afterwards, continuous writing is performed. Meanwhile, in the closing of open pages shown in FIG. 6, some pages associated with second dummy wordline WL6 are programmed with dummy pattern. However, the inventive concept is not limited thereto. For example, pages associated with all dummy wordlines may be programmed with dummy pattern for the open page closing.

Figure 7:
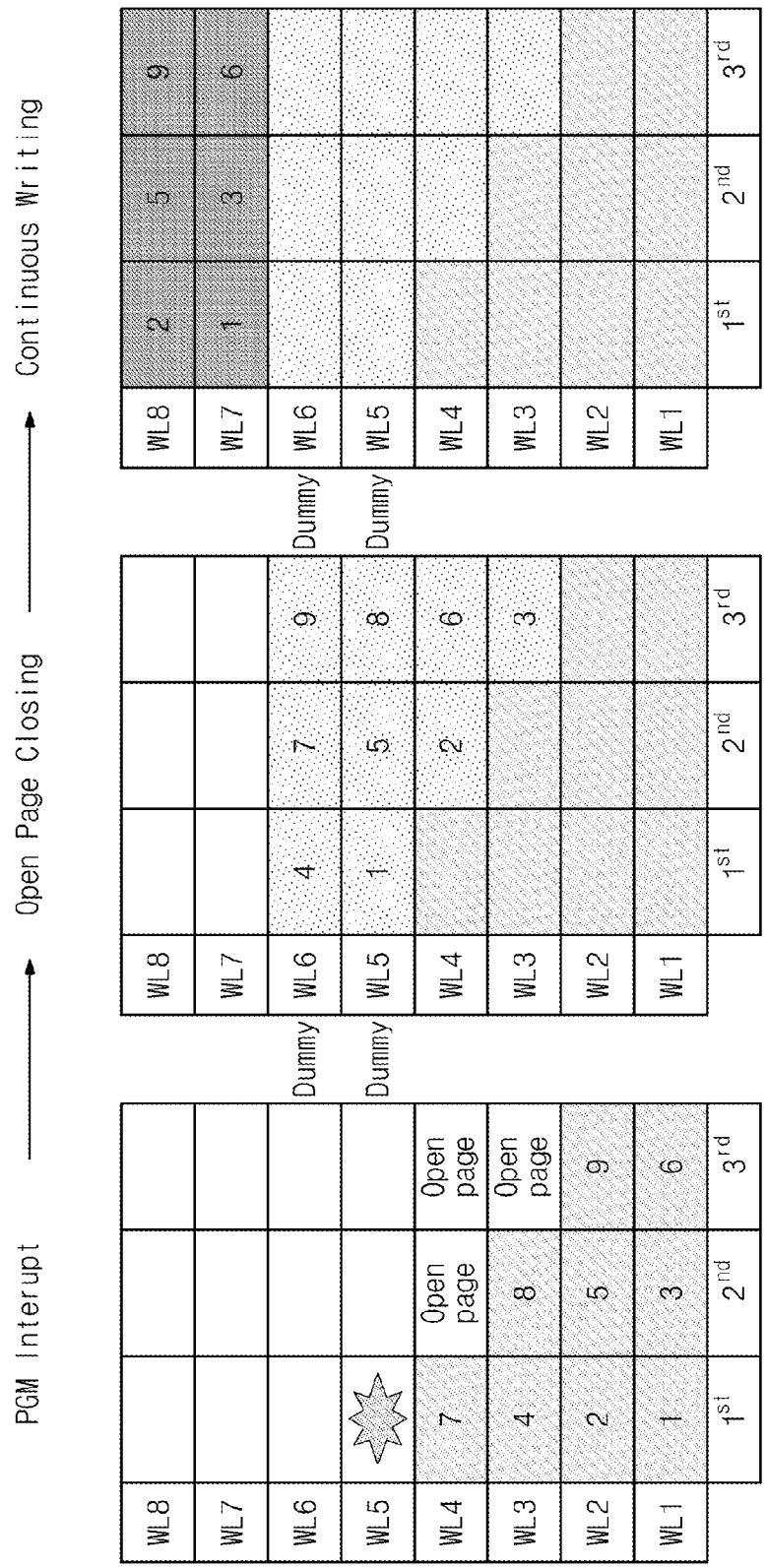
FIG. 7 is a diagram for describing a method of closing open pages in a storage device, according to a fifth embodiment of the inventive concept.

FIG. 7 is a diagram for describing a method of closing open pages in a storage device according to a fifth embodiment of the inventive concept.

Referring to FIG. 7, open pages, all pages associated with a dummy wordline WL5, and all pages associated with a second dummy wordline WL6 are programmed with dummy pattern data for open page closing according to address scramble. Afterwards, continuous writing is performed.

In the open page closing shown in FIGS. 3 to 7, pages associated with a dummy wordline WL5 or WL6 are programmed according to a predetermined order. However, the inventive concept is not limited thereto. For example, in the open page closing, at least two pages associated with a dummy wordline are programmed at the same time.

Figure 8:
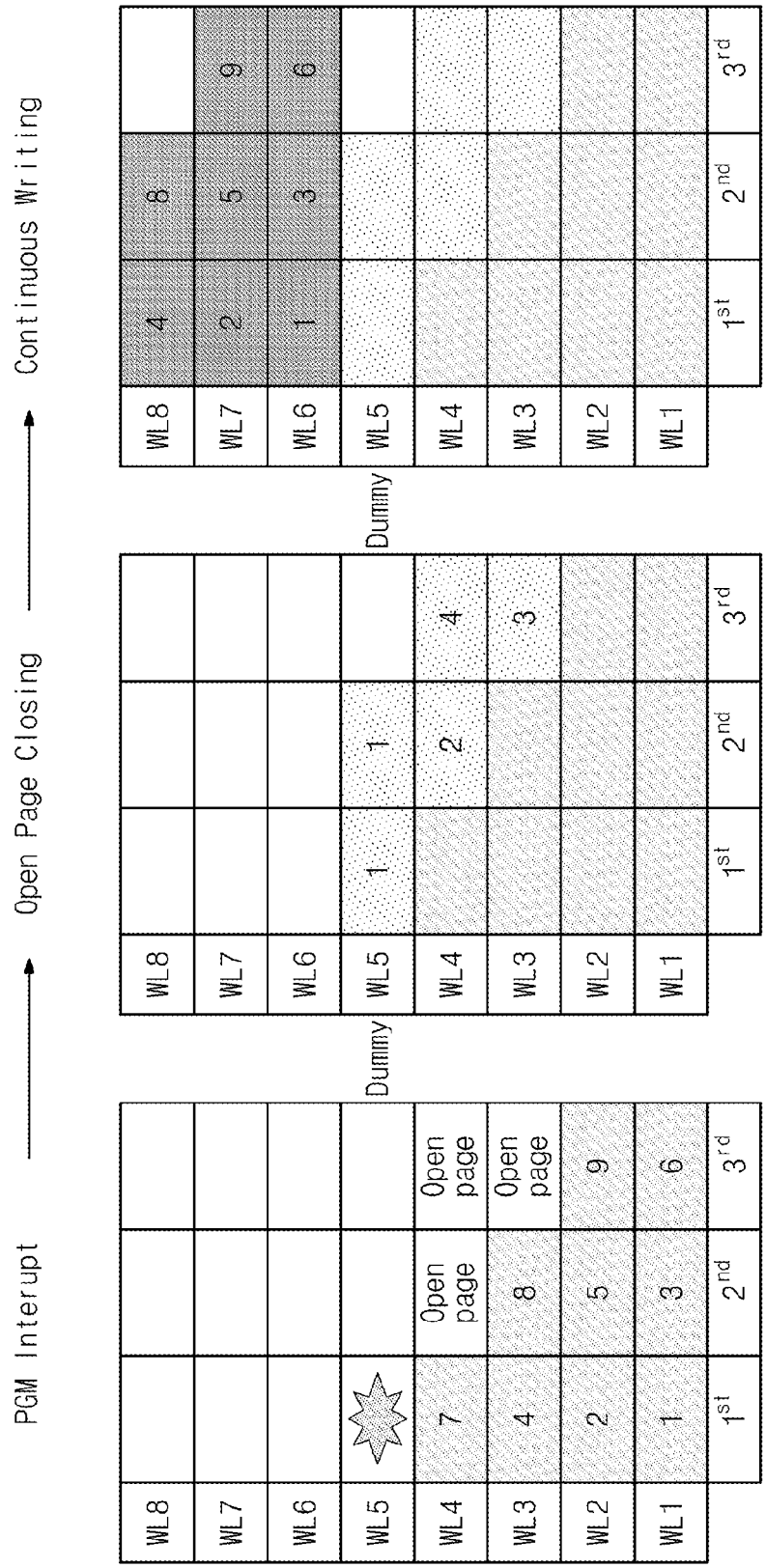
FIG. 8 is a diagram for describing a method of closing open pages in a storage device, according to a sixth embodiment of the inventive concept.

FIG. 8 is a diagram for describing a method of closing open pages in a storage device, according to a sixth embodiment of the inventive concept.

Referring to FIG. 8, open page closing is performed by programming first and second pages associated with a dummy wordline WL5 with dummy pattern data at the same time and programming open pages with dummy pattern data according to address scramble. Afterwards, continuous writing is performed. In the open page closing shown in FIG. 8, two pages associated with dummy wordline WL5 are programmed with dummy pattern data at the same time. However, the inventive concept is not limited thereto. For example, in open page closing, all pages associated with a dummy wordline may be programmed with dummy pattern data at the same time.

Figure 9:
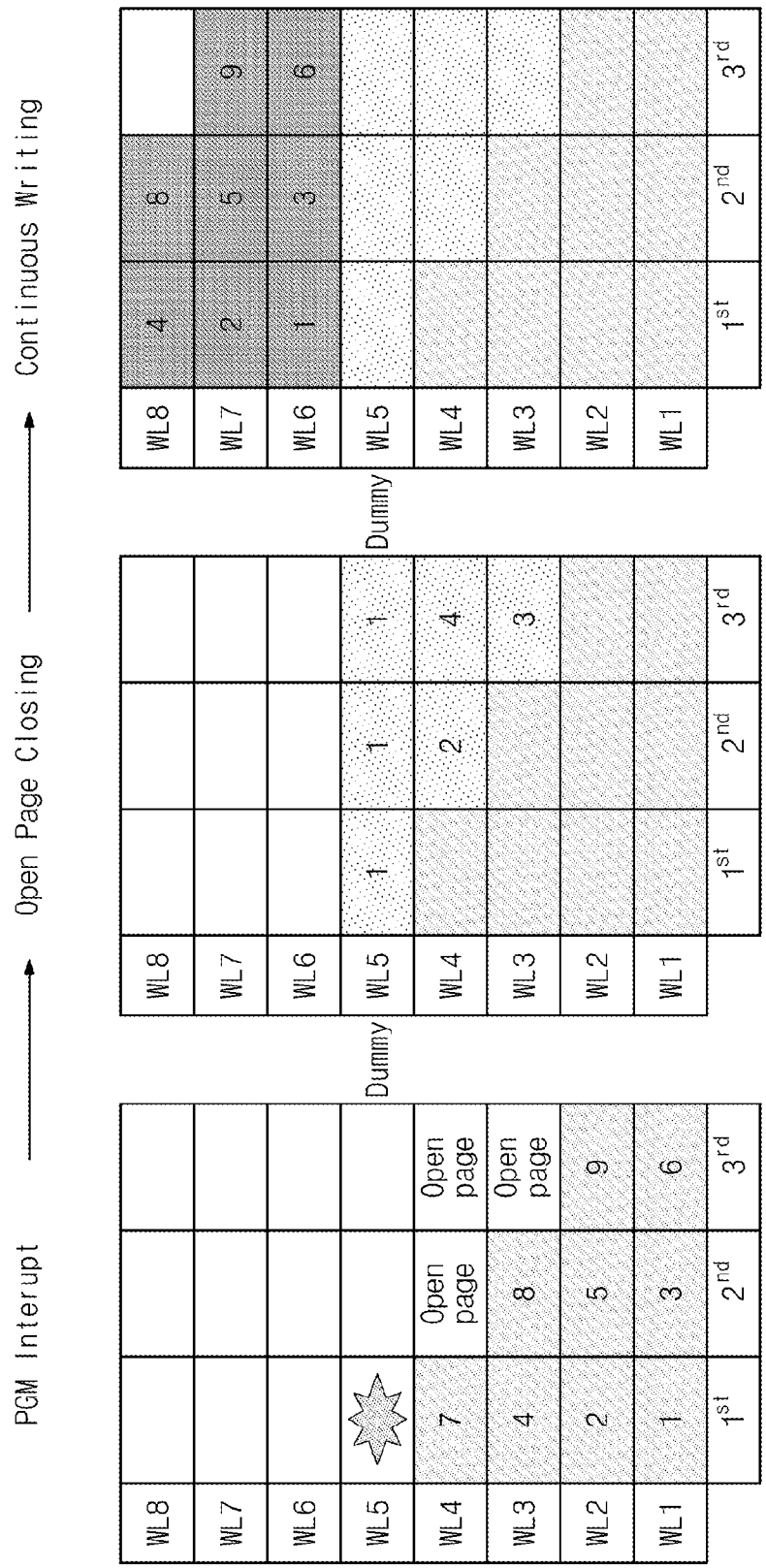
FIG. 9 is a diagram for describing a method of closing open pages in a storage device, according to a seventh embodiment of the inventive concept.

FIG. 9 is a diagram for describing a method of closing open pages in a storage device, according to a seventh embodiment of the inventive concept.

Referring to FIG. 9, open page closing may be performed by programming all pages associated with a dummy wordline WL5 with dummy pattern data at the same time and by programming open pages with dummy pattern data according to address scramble. Afterwards, continuous writing may be performed.

With open page closing shown in FIGS. 3 to 9, there may be performed a dummy pattern program operation in which at least one page associated with at least one dummy wordline is programmed. However, the inventive concept is not limited thereto. For example, a program operation may not be performed with respect to a dummy wordline at the open page closing. Also, the open page closing shown in FIGS. 3 to 9 may use at least one dummy wordline. However, the inventive concept is not limited thereto. For example, an open page may not be closed and may therefore remain in an open page state.

Figure 10:
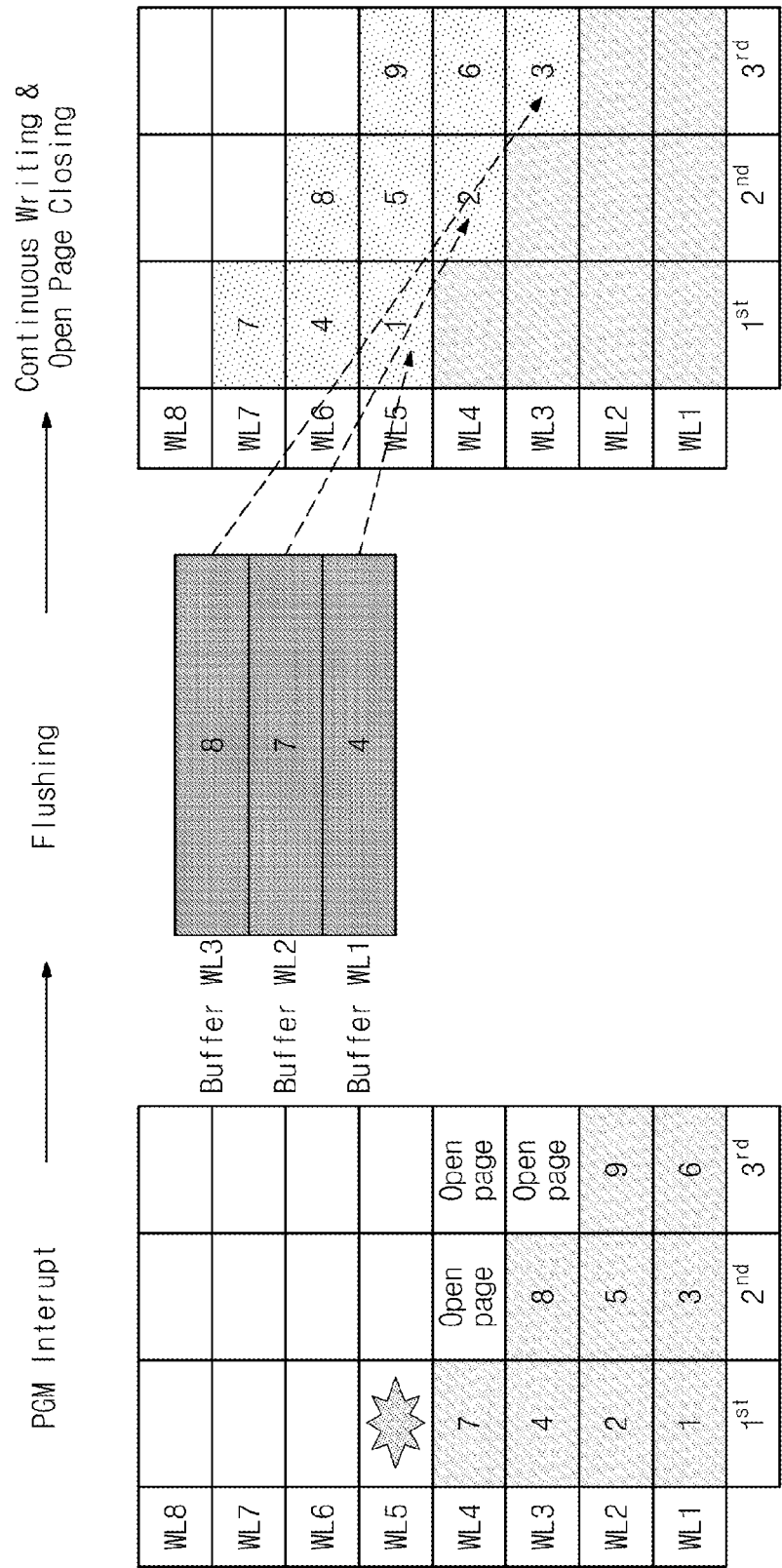
FIG. 10 is a diagram for describing a method of closing open pages in a storage device, according to an eighth embodiment of the inventive concept.

FIG. 10 is a diagram for describing a method of closing open pages in a storage device, according to an eighth embodiment of the inventive concept.

Referring to FIG. 10, open pages may be generated at third and fourth wordlines WL3 and WL4 due to an unexpected end of a program sequence. In this case, data may be read from programmed pages (or, referred to as closed pages) 4, 7, and 8 of the third and fourth wordlines WL3 and WL4, and the read data may be stored in a buffer area.

In some embodiments, the buffer area may comprise memory cells connected to buffer wordlines Buffer WL1 to Buffer WL3. Each of the memory cells connected to buffer wordlines Buffer WL1 to Buffer WL3 may be a single level cell. In some other embodiments, the buffer area may be a buffer memory (e.g., a DRAM, a PRAM, an SRAM, etc.) of a memory controller 200 (refer to FIG. 1).

If a sequence is treated as an open page state and a program sequence again commences, memory controller 200 may read data from the buffer area and may perform continuous writing on the read data according to address scramble. The read data may be data read from programmed pages (or, referred to as closed pages) of the third and fourth wordlines WL3 and WL4. That is, data of fourth, eighth, and ninth pages before generation of open pages may be stored in first, second, and third pages through the continuous writing.

In open page closing as described above, data of programmed pages (also referred to as closed pages) may be flushed into the buffer area, and continuous writing may be sequentially made from the flushed data. That is, open pages may be programmed with the flushed data or with user data.

In the above-described open page closing, data of programmed pages of a wordline including an open page may be buffered, and continuous writing may start using the buffered data. The continuous writing may be performed without using a dummy wordline or dummy pattern data, and open pages may be closed.

Figure 11:
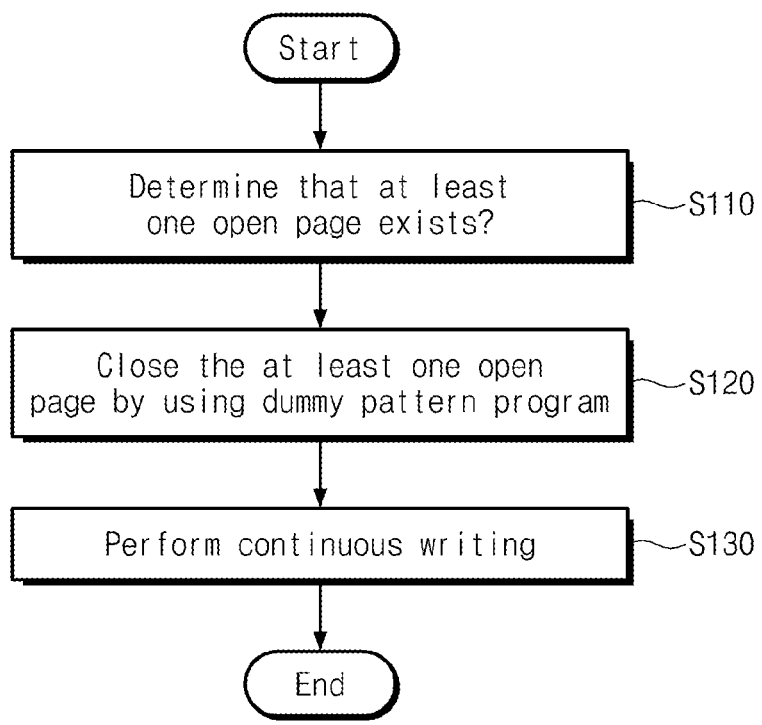
FIG. 11 is a flowchart illustrating a method of programming a storage device according to an embodiment of the inventive concept.

FIG. 11 is a flowchart illustrating a method of programming a storage device according to an embodiment of the inventive concept. The method of FIG. 11 will be described with reference to FIGS. 1 to 9 and 11.

In step S110, memory controller 200 determines whether at least one open page is generated at a memory block. For example, upon sudden power-off, memory controller 200 may determine whether an open page is generated at a memory block, using a map table associated with a program operation. Afterwards, when a write operation on the memory block including the open page is requested, memory controller 200 may close the open page using one of methods described with reference to FIGS. 3 to 9. That is, in step S120, open pages may be closed using a dummy pattern program operation.

In some embodiments, the dummy pattern program operation may be performed using a high-speed program mode (HSP). A program speed of the high-speed program mode may be faster than that of a normal program mode. Afterwards, in step S130, there may be performed continuous writing on a corresponding memory block. In the method of FIG. 11, continuous writing is performed after closing open pages through the dummy pattern program operation.

Figure 12:
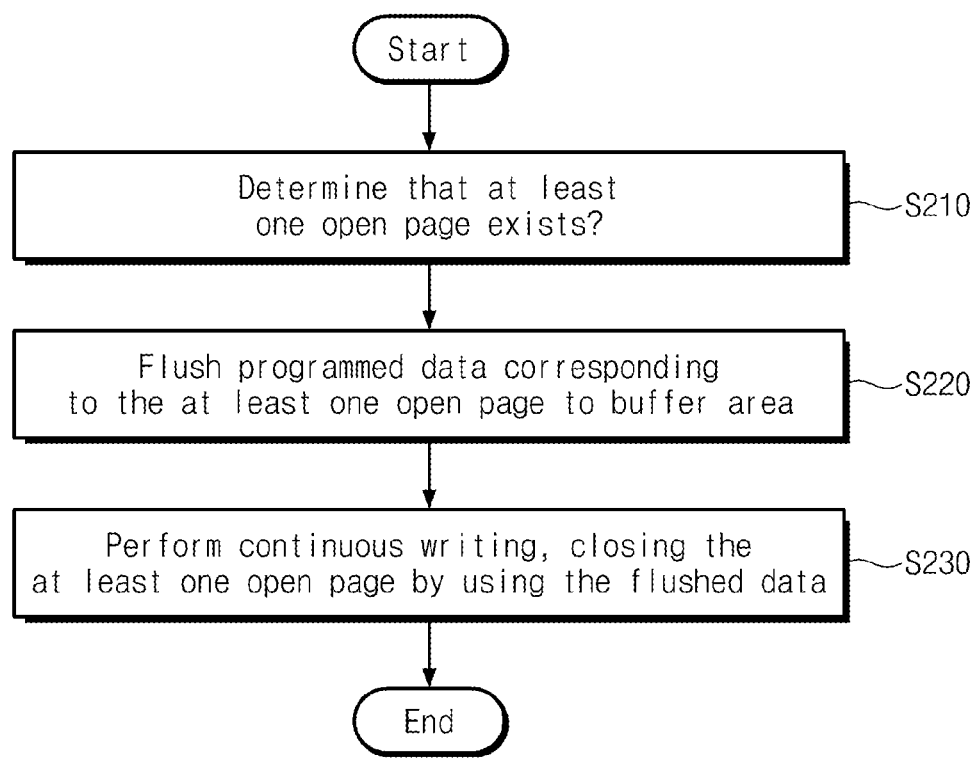
FIG. 12 is a flowchart illustrating a method of programming a storage device according to a second embodiment of the inventive concept.

FIG. 12 is a flowchart illustrating a method of programming a storage device according to a second embodiment of the inventive concept. The method of FIG. 12 will be described with reference to FIGS. 1, 2, 10, and 12.

In step S210, memory controller 200 may determine whether at least one open page is generated at a memory block. Afterwards, in step S220, when a write operation is requested with respect to the memory block including the open page, memory controller 200 closes the open page using a method described with reference to FIG. 10. In step S230, continuous writing on the memory block may be performed using flushed data. As a result, the continuous writing is performed, and open pages are closed. In the method of FIG. 12, data of previously programmed pages may be flushed, and the continuous writing may be performed using the flushed data.

Figure 13:
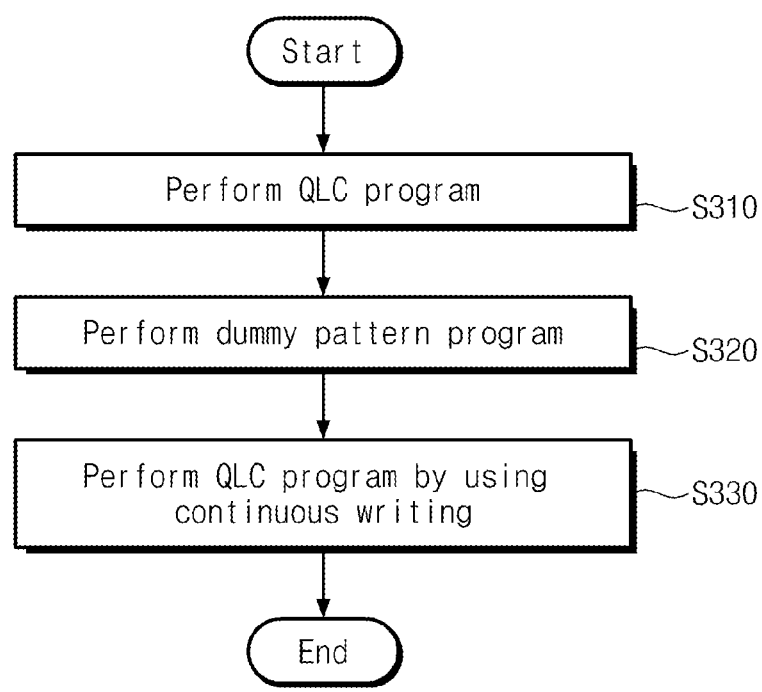
FIG. 13 is a flowchart illustrating a method of programming a storage device according to a third embodiment of the inventive concept.

FIG. 13 is a flowchart illustrating a method of programming a storage device according to a third embodiment of the inventive concept. The method of FIG. 13 will be described with reference to FIGS. 1 to 10 and 13. It is assumed that a memory cell is a quad level cell (QLC). In step S310, a QLC program operation on a memory block is performed according to a program sequence. In some embodiments, the QLC program operation may be performed according to a shadow program manner or a reprogramming manner. After the program sequence is suddenly ended, in step S320, a dummy pattern program operation on a memory block may be performed to close open pages. In some embodiments, the dummy pattern program operation may be the QLC program operation, a TLC program operation, an MLC program operation, or an SLC program operation. Afterwards, in step S330, the QLC program operation on the memory block is performed using another program sequence and continuous writing.

The inventive concept is also applicable to methods of closing open pages when a multi-bit program operation is performed in a reprogramming manner. In the context of the reprogramming manner, an open page is a page that has not been programmed with a fine program operation. With the open page closing method according to the reprogramming manner, after open pages may be closed using dummy pattern data or buffered data, continuous writing according to the reprogramming manner may be performed. With the program method of the FIG. 13, continuous writing may be performed after the dummy pattern program operation.

FIGS. 14 through 18 illustrate various contexts in which the above described methods may be applied.

Figure 14:
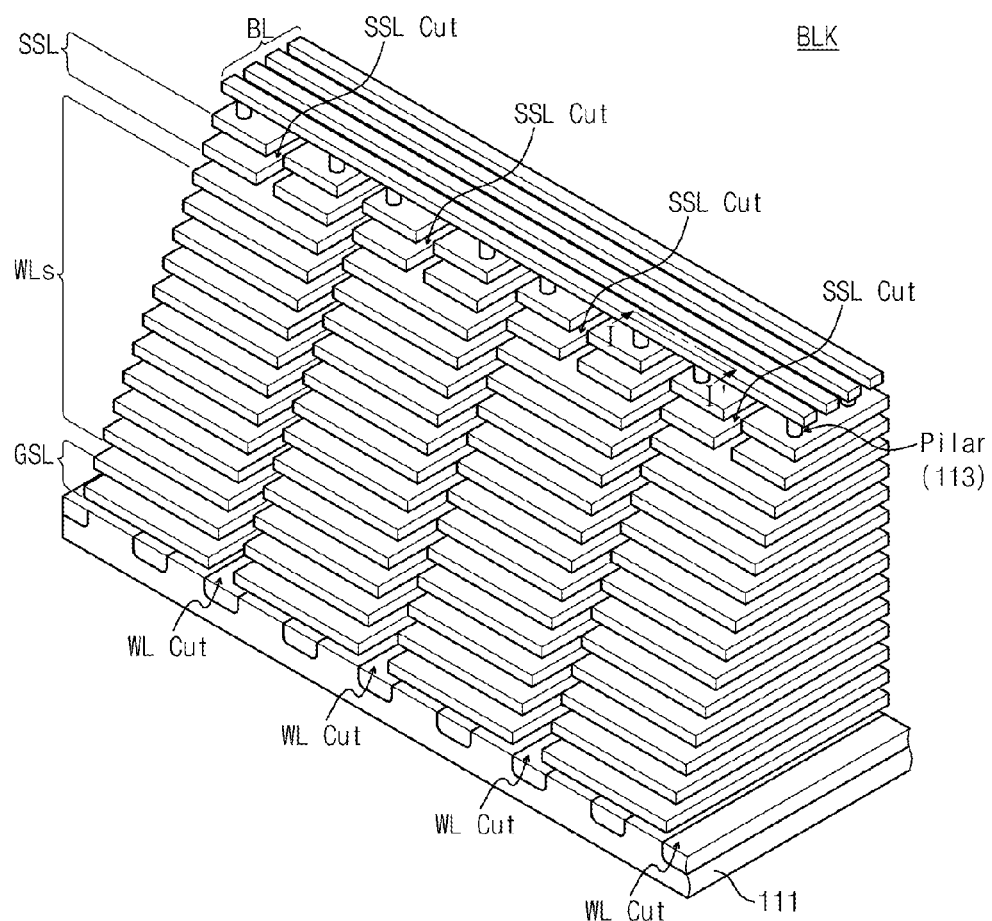
FIG. 14 is a perspective view of a vertical NAND (VNAND) block of according to an embodiment of the inventive concept.

FIG. 14 is a perspective view of a VNAND block of according to an embodiment of the inventive concept.

Referring to FIG. 14, four sub blocks may be formed on a substrate. Each sub block may be formed by stacking at least one ground selection line GSL, a plurality of wordlines, and at least one string selection line SSL on the substrate and between wordline cuts in a plate shape. The string selection line SSL may be separated by string selection line cuts. Although not shown in FIG. 14, each wordline cut may include a common source line CSL. In some embodiments, the common source lines CSL included in the wordline cuts may be interconnected. A string may be formed by making a pillar 113 connected to a bitline penetrate the at least one string selection line SSL, the wordlines, and the at least one ground selection line GSL.

In FIG. 14, there is illustrated an embodiment in which a structure between wordline cuts is a sub block. However, the inventive concept is not limited thereto. For example, a structure between a wordline cut and a string selection line cut may be defined as a sub block. Memory block BLK may be implemented with a merged wordline structure where two wordlines are merged to one.

Figure 15:
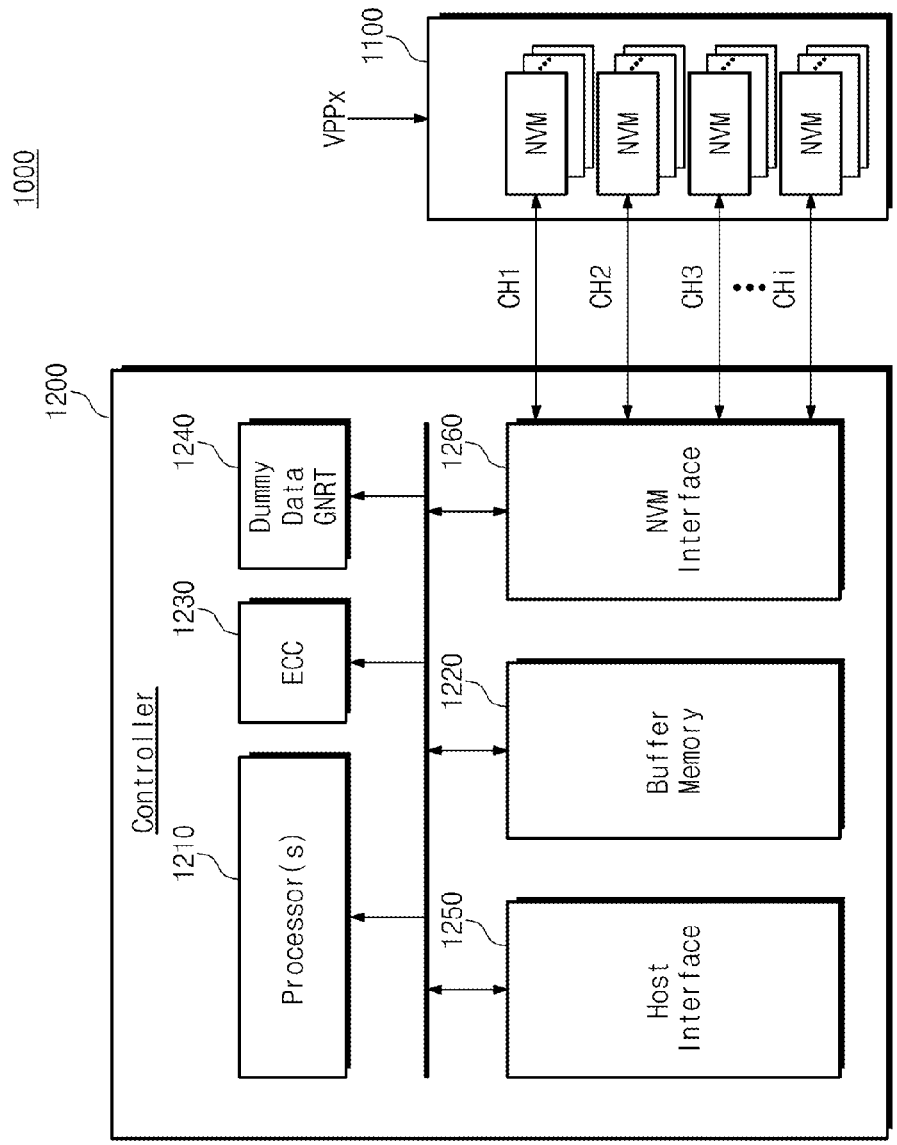
FIG. 15 is a block diagram illustrating a solid state drive according to an embodiment of the inventive concept.

FIG. 15 is a block diagram illustrating a solid state drive (SSD) 1000 according to an embodiment of the inventive concept.

Referring to FIG. 15, SSD 1000 comprises a plurality of nonvolatile memory devices 1100 and an SSD controller 1200. SSD 1000 may be implemented by a storage device 10 shown in FIG. 1.

Nonvolatile memory devices 1100 may be implemented to be provided with an external high voltage VPPx optionally. SSD controller 1200 may be connected to nonvolatile memory devices 1100 through a plurality of channels CH1 to CHi (i>1). SSD controller 1200 may include one or more processors 1210, a buffer memory 1220, an ECC block 1230, a dummy data generator 1240, a host interface 1250, and a nonvolatile memory interface 1260. SSD controller 1200 may be implemented to conduct continuous writing after or while closing open pages as described with reference to FIGS. 1 to 13.

Buffer memory 1220 may store data needed to drive SSD controller 1200. In some embodiments, buffer memory 1220 may comprise a plurality of memory lines each storing data or a command. The plurality of memory lines may be mapped onto cache lines 1212 using various methods. Also, buffer memory 1220 may be used to buffer data to be used for a fine program operation at a write request. In FIG. 15, there is illustrated an embodiment in which buffer memory 1220 is included in SSD controller 1200. However, the inventive concept is not limited thereto. For example, buffer memory 1220 may be placed outside SSD controller 1200.

ECC block 1230 may calculate error correction code values of data to be programmed at a writing operation and may correct an error of read data using an error correction code value at a read operation. In a data recovery operation, ECC block 1230 may correct an error of data recovered from nonvolatile memory devices 1100. Although not shown in FIG. 15, a code memory may be further included to store code data needed to drive SSD controller 1200. The code memory may be implemented by a nonvolatile memory device.

Dummy data generator 1240 may generate random data as dummy pattern data using a seed value. In particular, dummy data generator 1240 may generate the dummy pattern data using an address corresponding to a target of a dummy program operation as the seed value. In some other embodiments, dummy data generator 1240 may generate data having a fixed dummy pattern (e.g., '10101010 . . . 10' or '010101 . . . 01'). Host interface 1250 may provide an interface with an external device. Nonvolatile memory interface 1260 may provide an interface with nonvolatile memory devices 1100.

Figure 16:
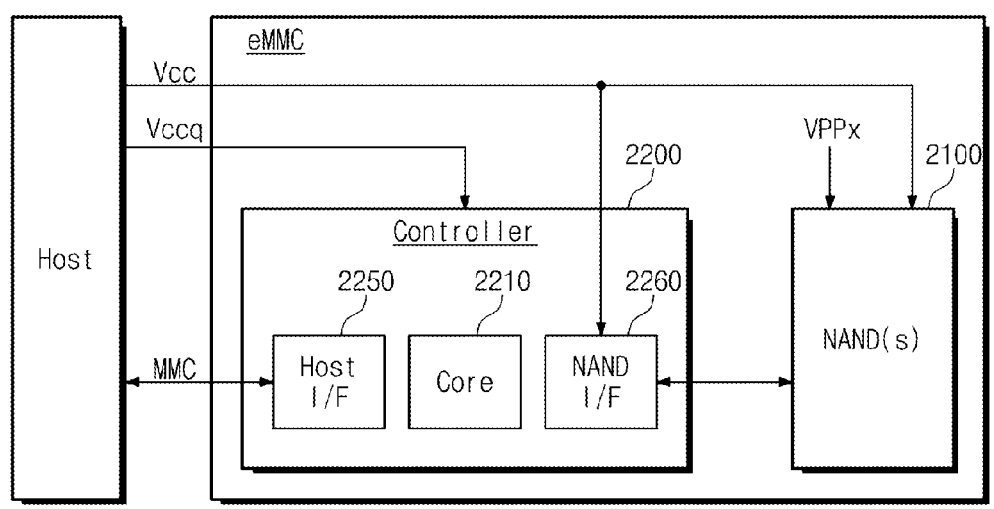
FIG. 16 is a block diagram illustrating an embedded multimedia card (eMMC) according to an embodiment of the inventive concept.

FIG. 16 is a block diagram illustrating an eMMC 2000 according to an embodiment of the inventive concept.

Referring to FIG. 16, eMMC 2000 comprises one or more NAND flash memory devices 2100 and a controller 2200. EMMC 2000 may be implemented by a storage device 10 shown in FIG. 1.

Controller 2200 may be connected with the NAND flash memory device 2100 via a plurality of channels. Controller 2200 may include one or more controller cores 2210, a host interface 2250, and a NAND interface 2260. Controller core 2210 may control an overall operation of eMMC 2000. Host interface 2250 may be configured to perform an interface between the controller 2210 and a host. NAND interface 2260 may be configured to provide an interface between NAND flash memory device 2100 and controller 2200. In some embodiments, host interface 2250 may be a parallel interface (e.g., an MMC interface). In other example embodiments, host interface 2250 of eMMC 2000 may be a serial interface (e.g., UHS-II, UFS, etc.).

eMMC 2000 may receive power supply voltages Vcc and Vccq from the host. Herein, power supply voltage Vcc (e.g., about 3.3V) may be supplied to NAND flash memory device 2100 and NAND interface 2260, and power supply voltage Vccq (e.g., about 1.8V/3.3V) may be supplied to controller 2200. In some embodiments, eMMC 2000 may be optionally supplied with an external high voltage. In eMMC 2000, open pages may be closed for continuous writing, so data reliability and lifetime may be improved.

Figure 17:
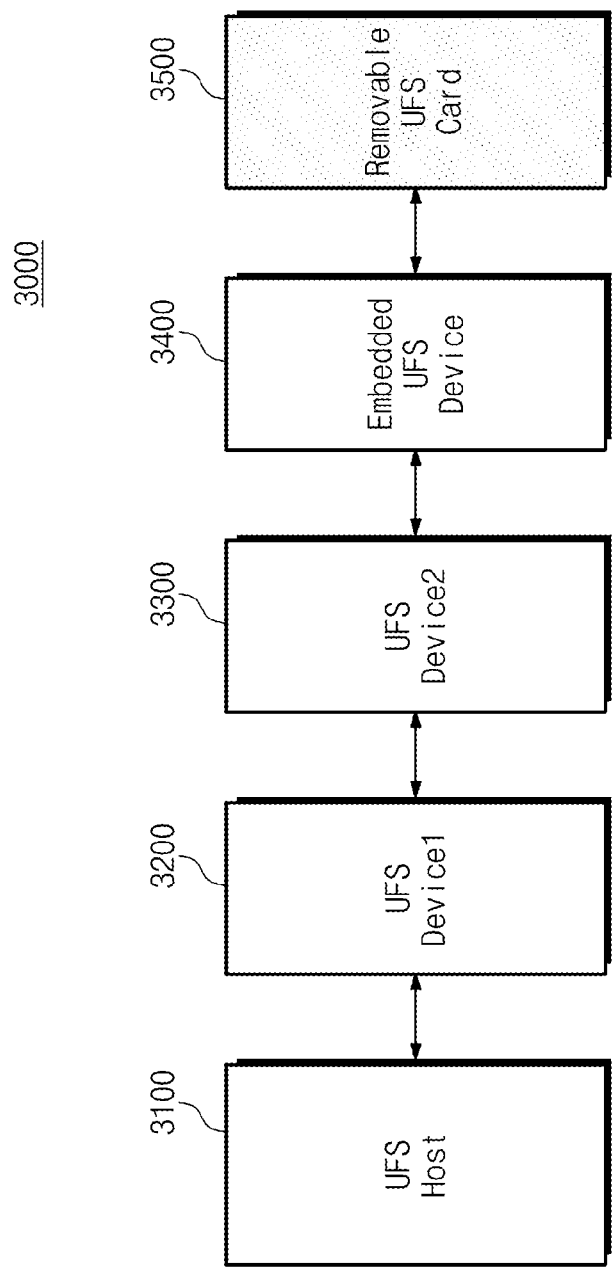
FIG. 17 is a block diagram illustrating a Universal File Storage (UFS) system according to an embodiment of the inventive concept.

FIG. 17 is a block diagram illustrating a UFS system 3000 according to an embodiment of the inventive concept.

Referring to FIG. 17, UFS system 3000 comprises a UFS host 3100, UFS devices 3200 and 3300, an embedded UFS device 3400, and a removable UFS card 3500. UFS host 3100 may be an application processor of a mobile device. Each of UFS host 3100, UFS devices 3200 and 3300, embedded UFS device 3400, and removable UFS card 3500 may communicate with external devices through the UFS protocol. At least one of UFS devices 3200 and 3300, embedded UFS device 3400, and removable UFS card 3500 may be implemented by a storage device show in FIG. 1.

Meanwhile, embedded UFS device 3400 and removable UFS card 3500 may perform communications using protocols different from the UFS protocol. UFS host 3100 and removable UFS card 3500 may communicate through various card protocols (e.g., UFDs, MMC, SD (secure digital), mini SD, Micro SD, etc.).

Figure 18:
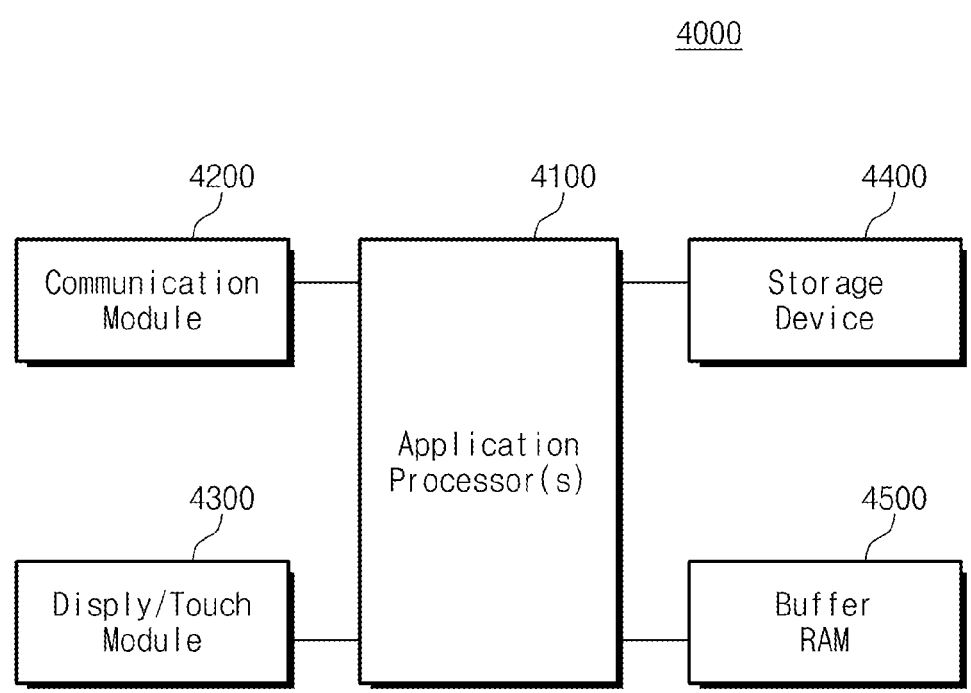
FIG. 18 is a block diagram illustrating a mobile device according to an embodiment of the inventive concept.

FIG. 18 is a block diagram illustrating a mobile device 4000 according to an embodiment of the inventive concept.

Referring to FIG. 18, mobile device 4000 comprises an application processor 4100, a communication module 4200, a display/touch module 4300, a storage device 4400, and a buffer RAM 4500.

Application processor 4100 controls overall operations of mobile device 4000. Communication module 4200 may be implemented to perform wireless or wire communications with an external device. Display/touch module 4300 may be implemented to display data processed by application processor 4100 or to receive data through a touch panel. Storage device 4400 may be implemented to store user data. Storage device 4400 may be eMMC, SSD, UFS device, etc. Storage device 4400 may be a storage device show in in FIG. 1.

The buffer may be implemented to store data needed for a processing operation of mobile device 4000 temporarily. Mobile device 4000 according to an embodiment of the inventive concept may efficiently close open pages to cope with periodic sudden power-off, so system performance may be overall improved.

A memory system or a storage device according to embodiments of the inventive concept may be packed using various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

While the inventive concept has been described with reference to some embodiments, it will be apparent to those skilled in the art that various changes and modifications may be performed without departing from the scope of the inventive concept. Therefore, it should be understood that the above embodiments are not limiting, but illustrative.

What is claimed is:

1. A method of programming a storage device comprising at least one nonvolatile memory device and a memory controller, comprising:
   determining whether at least one open page exists in a memory block of the nonvolatile memory device; and
   as a consequence of determining that at least one open page exists in the memory block, closing the at least one open page through a dummy pattern program operation, and thereafter performing a continuous writing operation on the memory block.

2. The method of claim 1, wherein the determination of whether at least one open page exists in the memory block is performed as a consequence of an unexpected loss of power.

3. The method of claim 1, wherein the determination of whether at least one open page exists in the memory block is performed when a write operation is requested with respect to the memory block.

4. The method of claim 1, wherein the continuous writing operation is performed according to an address scramble technique, and wherein the closing the at least one open page comprises programming at least one page associated with at least one dummy wordline and the at least one open page with dummy pattern data according to a predetermined order.

5. The method of claim 4, wherein the predetermined order complies with the address scramble technique.

6. The method of claim 4, wherein the at least one page comprises all pages associated with a wordline of the memory block, and the predetermined order complies with the address scramble technique.

7. The method of claim 4, wherein the at least one dummy wordline comprises a first dummy wordline and a second dummy wordline,
   wherein the at least one page comprises at least one page of the first dummy wordline but not all pages of the first dummy wordline, and all pages of the second dummy wordline, and
   wherein the predetermined order complies with the address scramble technique.

8. The method of claim 4, wherein the at least one dummy wordline comprises a first dummy wordline and a second dummy wordline,
   wherein the at least one page comprises all pages of the first dummy wordline and all pages of the second dummy wordline, and
   wherein the predetermined order complies with the address scramble technique.

9. The method of claim 4, wherein the at least one page is a plurality of pages but not all pages of a corresponding dummy wordline, and wherein the plurality of pages is programmed with the dummy pattern data.

10. The method of claim 4, wherein the at least one page comprises all pages of a dummy wordline that are simultaneously programmed with the dummy pattern data.

11. The method of claim 1, further comprising generating the dummy pattern data for the dummy pattern program operation.

12. The method of claim 11, wherein the dummy pattern data is generated by a random data generator.

13. The method of claim 11, wherein a program speed of the dummy pattern program operation is faster than a program operation of the continuous writing operation.

14. The method of claim 1, wherein the continuous writing operation is a three level cell (TLC) program operation complying with an address scramble technique.

15. A method of programming a storage device comprising at least one nonvolatile memory device and a memory controller, comprising:
   performing a first Quad Level Cell (QLC) program operation at a memory block;
   performing a dummy pattern program operation on at least one page associated with at least one dummy wordline of the memory block; and
   after the dummy pattern program operation, performing a continuous writing operation on the memory block to perform a second QLC program operation.

16. The method of claim 15, wherein the first and second QLC program operations use a shadow program technique.

* * * * *